(12) United States Patent
Yamamoto et al.

(10) Patent No.: US 11,796,585 B2
(45) Date of Patent: Oct. 24, 2023

(54) CHARGE DETECTION AND QUANTIZATION

(71) Applicant: Baker Hughes Holdings LLC, Houston, TX (US)

(72) Inventors: Eugene Toyonari Yamamoto, Bay Village, OH (US); Scot Alan Shermer, Chesterland, OH (US); Andrew Walter Hutchinson, Richmond, VA (US)

(73) Assignee: Baker Hughes Holdings LLC, Houston, TX (US)

( * ) Notice: Subject to any disclaimer, the term of this patent is extended or adjusted under 35 U.S.C. 154(b) by 15 days.

(21) Appl. No.: 17/199,870

(22) Filed: Mar. 12, 2021

(65) Prior Publication Data

US 2021/0349141 A1 Nov. 11, 2021

Related U.S. Application Data

(60) Provisional application No. 63/020,609, filed on May 6, 2020.

(51) Int. Cl.
*G01R 31/52* (2020.01)
*G01R 31/12* (2020.01)
*G01R 31/16* (2006.01)

(52) U.S. Cl.
CPC ......... *G01R 31/1272* (2013.01); *G01R 31/16* (2013.01); *G01R 31/52* (2020.01)

(58) Field of Classification Search
CPC .... G01R 31/1272; G01R 31/52; G01R 31/16; G01R 31/083; G01R 15/165; G01R 15/144
See application file for complete search history.

(56) References Cited

U.S. PATENT DOCUMENTS 4,063,168 A * 12/1977 Franke ................ G01R 31/08
324/123 R
6,313,640 B1 * 11/2001 Nasrallah ........... G01R 31/1272
324/536

(Continued)

FOREIGN PATENT DOCUMENTS

CN 106054037 A * 10/2016 ......... G01R 31/1272
CN 106338674 A * 1/2017 ............. G01R 31/08

(Continued)

OTHER PUBLICATIONS

General Electric, Final Report Harsh-Environment Solid-State Gamma Detector for Down-hole Gas and Oil Exploration, chrome-extension://efaidnbmnnnibpcajpcglclefindmkaj/https://netl.doe.gov/sites/default/files/2018-05/NT42107_FinalReport.pdf (Year: 2007).*

(Continued)

*Primary Examiner* — Patrick Assouad
*Assistant Examiner* — Demetrius R Pretlow
(74) *Attorney, Agent, or Firm* — MINTZ LEVIN COHN FERRIS GLOVSKY AND POPEO, PC

(57) ABSTRACT

A method includes receiving an output signal from a conductive element configured within a dielectric material. The conductive element can have an input voltage applied thereto and the output signal can include a plurality of signal amplitudes indicative of electric charges discharged across a gap between the conductive element and the dielectric material in response to the applied input voltage. The method can also include determining charge characterization data and classifying a material and a geometry of the conductive element and/or the dielectric material. The classification can include an operational state of the conductive element and/or the dielectric material. Related systems, apparatuses, and non-transitory computer readable mediums are also described.

13 Claims, 6 Drawing Sheets

(56) References Cited

U.S. PATENT DOCUMENTS

| | | | | |
|---|---|---|---|---|
| 6,445,189 B1 * | 9/2002 | Pakonen | ................ | G01R 31/50 |
| | | | | 324/536 |
| 2002/0130668 A1 * | 9/2002 | Blades | ............... | G01R 31/1272 |
| | | | | 324/536 |
| 2006/0038573 A1 * | 2/2006 | Sarkozi | .............. | G01R 31/1272 |
| | | | | 324/536 |
| 2012/0278013 A1 * | 11/2012 | Ganesh | ............. | G01R 31/1272 |
| | | | | 702/58 |
| 2012/0290229 A1 * | 11/2012 | Cavallini | .......... | G01N 33/2841 |
| | | | | 324/553 |
| 2015/0355307 A1 * | 12/2015 | Wang | ................ | G01R 31/1272 |
| | | | | 324/536 |

FOREIGN PATENT DOCUMENTS

| | | | | | | |
|---|---|---|---|---|---|---|
| CN | 107024654 | A | * | 8/2017 | ............. | G01N 27/92 |
| CN | 107505540 | A | * | 12/2017 | ............. | G01D 21/02 |
| CN | 110045230 | A | * | 7/2019 | | |
| CN | 110658421 | A | * | 1/2020 | ......... | G01R 31/1227 |
| CN | 110675712 | A | * | 1/2020 | ............. | G01R 31/08 |
| CN | 110967604 | A | * | 4/2020 | ......... | G01R 31/1272 |
| CN | 112867930 | A | * | 5/2021 | ............. | G01R 15/06 |
| DE | 4123725 | A1 | * | 8/1992 | | |
| JP | 2020030125 | A | * | 2/2020 | | |

OTHER PUBLICATIONS

International Search Report received for PCT Patent International Application No. PCT/US2021/025390 dated Jul. 26, 2021, 3 pages.

\* cited by examiner

CHARGE DETECTION AND QUANTIZATION

RELATED APPLICATION

This application claims priority under 35 U.S.C. § 119(e) to U.S. Provisional Application No. 63/020,609 filed May 6, 2020, the entire contents of which are hereby expressly incorporated by reference herein.

BACKGROUND

Electrical components, such as sensors, can include electrically conductive elements configured within insulative, dielectric materials. Electrical components can include defects, originating at the time of manufacture and/or during operational use. Undiagnosed defects can cause the electrical component to become inoperable and as a result, can cause a component, machine, or system containing the electrical component to fail resulting in yield decreases, cost, and quality issues. Defects in the electrical components can produce noise within the component, machine, or system in which they are configured, especially in high-temperature and high-voltage conditions. Diagnosing defects, such as electrical charges emitted from the electrical components in high-temperature and high-voltage conditions, can be an important safety and quality control requirement to ensure that the electrical components, and the components, machines, and/or systems in which they are configured, are functioning properly.

SUMMARY

In an aspect, a method includes receiving an output signal from a conductive element configured within a dielectric material. The conductive element can have an input voltage applied thereto and the output signal can include a plurality of signal amplitudes indicative of electric charges emitted by the conductive element in response to the applied input voltage. The method can also include determining charge characterization data corresponding to the electric charges discharged across a gap between the conductive element and the dielectric material. The determining can be based on the plurality of signal amplitudes. The method can further include classifying a material and a geometry of the conductive element and/or the dielectric material based on the charge characterization data. The classification can include identifying an operational state of the conductive element and/or the dielectric material.

Non-transitory computer program products (i.e., physically embodied computer program products) are also described that store instructions, which when executed by one or more data processors of one or more computing systems, causes at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including a connection over a network (e.g. the Internet, a wireless wide area network, a local area network, a wide area network, a wired network, or the like), via a direct connection between one or more of the multiple computing systems, etc.

DESCRIPTION OF DRAWINGS

These and other features will be more readily understood from the following detailed description taken in conjunction with the accompanying drawings, in which.

Figure 1:
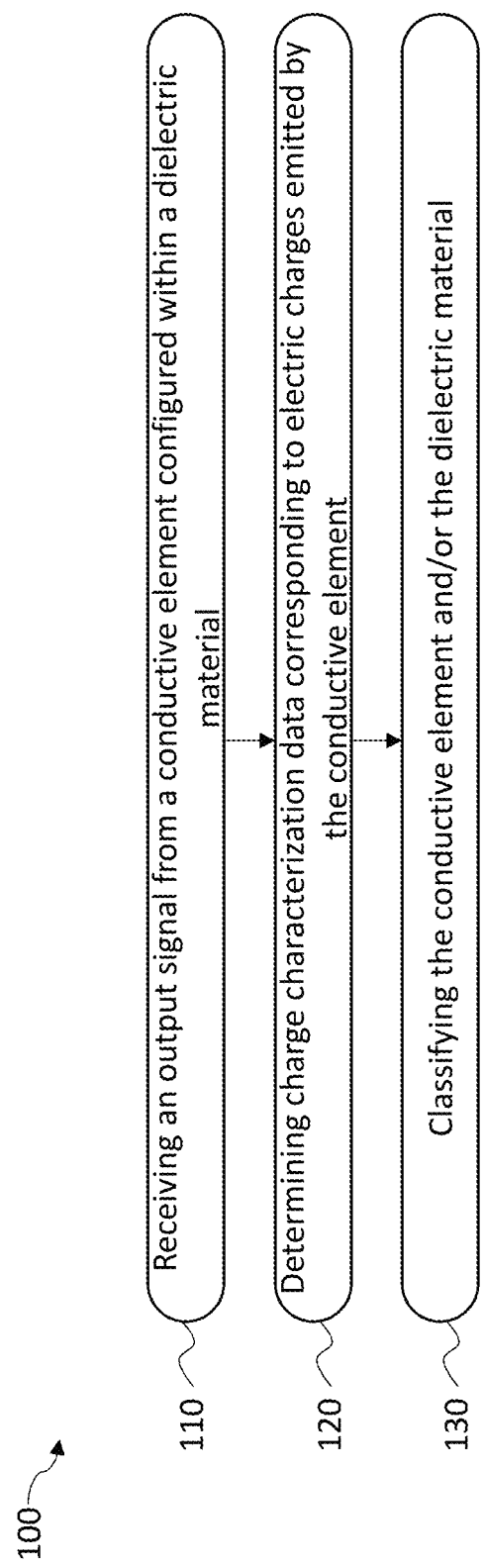
FIG. 1 illustrates an example process for classifying a conductive element and/or a dielectric material of an electrical component according to some implementations of the current subject matter.

It is noted that the drawings are not necessarily to scale. The drawings are intended to depict only typical aspects of the subject matter disclosed herein, and therefore should not be considered as limiting the scope of the disclosure.

DETAILED DESCRIPTION

Detection and quantization of electric charges can be an important requirement when evaluating the quality of electrical components and their insulators. Electric charges emitted by conductive elements configured within the electrical components can be emitted as pulses and can cause noise in electric signals conveyed via the conductive element. The conductive elements can emit electric charges as pulses due to ionization of a medium, such as air, which can surround the electrically charged conductive element. The charge pulses can occur due to corona discharges, which can occur when a high voltage is applied to an insulated conductor and creates sufficient field strength to cause breakdown regions associated with air gaps (or gaps associated with other gases) of the insulated conductor. The size and frequency of the charge pulses can be indicative of the breakdown regions and performance of an insulative material. In high-voltage systems, the conductive element can emit pulses of electric charges in a sporadic and frequent manner or varying magnitudes. The electric charge pulses can occur when the strength of an electric field surrounding the conductive element is high enough to form a conductive region, but not high enough to cause electrical arcing to nearby objects. Characterizing the type, frequency, source, and magnitude of the noise is important when assessing the quality and yield of electrical components during design, manufacturing, or deployed use. Characterizing noise in high-voltage, high-temperature conditions can be difficult to perform using traditional approaches.

Disadvantageously, some prior charge diagnosis systems measured direct current (DC) measurements by taking a time average of the electric charge pulses emitted by a conductive element. However, the noise pulses are very small, on the order of pico-Coulombs, so a resulting time-based average is on the order of pico-Amperes or less. In high-voltage conditions, the DC measurements may be unable to resolve pulses emitted by the conductive element from baseline high-voltage current on the order of 100's of pico-Amperes which may be present. In such conditions, 1 nano-Amperes of baseline noise may be present with current from the noise, which can be in pico-Amperes to 10's of pico-Amperes. In contrast, some implementations of the approach to charge diagnosis described herein can provide greater resolution for determining characteristics of the discrete noise events (e.g., electric charge discharges) generated by a conductive element in high-voltage and high-temperature conditions based on event-by-event characterizations of the discrete noise events.

An example approach to classifying an electrical component including a conductive element and/or a dielectric material is described herein. The approach can enable an improved charge diagnosis system, also described herein, to determine a measure of quality and operation of an electrical component, and a conductive element and/or dielectric material included in the electrical component. Using this approach, the charge diagnosis system can determine charge characterization data of electrical charges, which can be emitted by the conductive element in high-temperature and high-voltage conditions. The example approach described herein can include monitoring a magnitude and a distribution of the electrical charges and classifying the electrical component, the conductive element, and/or the dielectric material with respect to a level of quality and operation.

FIG. 1 illustrates an example process for classifying a conductive element and/or a dielectric material of an electrical component according to some implementations of the current subject matter. The process 100 can be performed by one or more components of a charge diagnosis system which can be coupled to the conductive element. The process can determine charge characterization data corresponding to electric charges emitted by the conductive element and discharged across a gas-filled gap between the conductive element and the dielectric material. Based on the charge characterization data, the material and the geometry of the conductive element and/or the dielectric material can be classified with respect to a measure of quality and operation. In some embodiments, classifying the dielectric material can include classifying a shape and/or a size of the dielectric material. For example, the charge characterization data can be used to classify the conductive element as operational or defective. By classifying conductive elements and/or dielectric materials with regard to quality and operation, some implementations of the charge diagnosis system described herein can diagnose noise signals in electrical components operating in high-temperature and high-voltage conditions during testing of deployed components in operation as well as during manufacturing and design of the electrical components prior to deployment. The charge diagnostic system and the approach described herein can allow designers, manufacturers, and operators of electrical components to ensure that the electrical components are operating as intended.

At 110, an output signal can be received from a conductive element configured within a dielectric material. The output signal can include a plurality of signal amplitudes, which can be indicative of one or more electric charges emitted by the conductive element. The plurality of signal amplitudes can correspond to pulses of noise associated with electric charges discharging from the conductive element into air and/or a dielectric material surrounding the conductive element. The conductive element can emit the electric charges in response to an input voltage applied to the conductive element. In some embodiments, the input voltage can be a high-voltage input in the range of 0-2000 V. In some embodiments, the conductive element can be configured within a high-temperature environment at or above 150 degrees Celsius.

At 120, charge characterization data corresponding to the electric charges emitted by the conductive element can be determined based on the plurality of signal amplitudes included in the received output signal. In some embodiments, the charge characterization data can include a magnitude of the electric charges, or noise pulses. For example, signal amplitudes in the range of 0.1 pico-Coulombs to 200 pico-Coulombs can be identified. The aforementioned range of signal amplitudes is not limiting. The range of signal amplitudes to be identified can be adjusted based on the application of the approach described herein. In some embodiments, the charge characterization data can include a distribution of the electric charges that occur within a pre-determined period of time. For example, a distribution of the electric charges can be determined by at least determining a number of signal amplitudes that occur within a pre-determined period of time, and providing the number of signal amplitudes with respect to the determined magnitude of electric charges. In some embodiments, the signal amplitudes occurring within a pre-determined period of time can include signal amplitudes in the range of 0.1 pico-Coulombs to 200 pico-Coulombs.

Determining the distribution of the electric charges can also include determining a moving average of the number of signal amplitudes occurring within the pre-determined time period, and providing the moving average of the number of signal amplitudes with respect to the determined magnitude of the electric charges. In some embodiments, determining the distribution of the electric charges can further include determining a plurality of threshold values corresponding to the determined magnitudes of the electric charges, and providing the number of signal amplitudes with respect to a plurality of threshold values. For example, the distribution of electric charges can be determined such that a number of electric charges per second can be provided in relation to one or more threshold values associated with a magnitude of the signal amplitudes of the electric charges.

At 130, the conductive element and/or the dielectric material can be classified based on the charge characterization data. For example, the charge characterization data can indicate whether the electric charges are indicative of a functional or faulty conductive element, a functional or faulty dielectric material, and/or a functional or faulty electric component which can include the conductive element and/or the dielectric material. In some embodiments, the charge characterization data can be indicative of a corona discharge emitted by the conductive element and the conductive element and/or the dielectric material can be classified based on identifying the electric charges as being associated with a corona discharge or an arc discharge.

Figure 2:
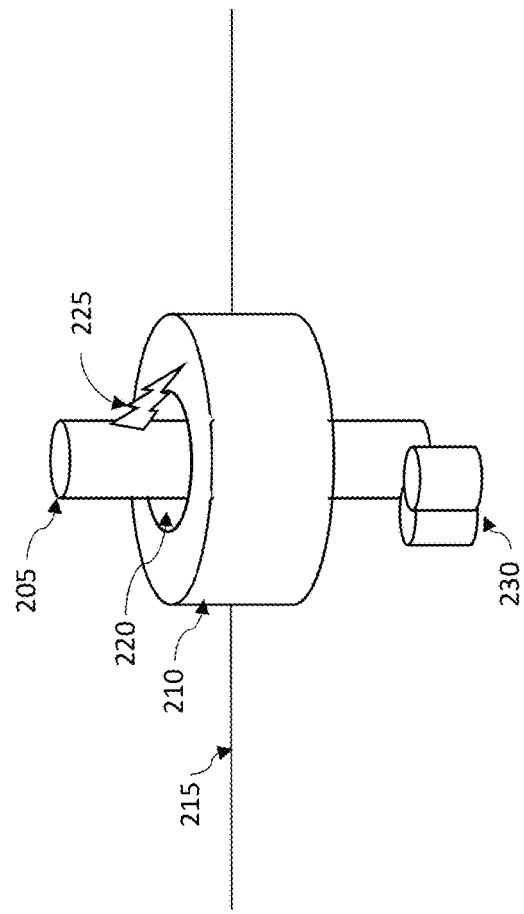
FIG. 2 illustrates a block diagram of an example electrical component including a conductive element and a dielectric material according to some implementations of the current subject matter.

FIG. 2 illustrates a block diagram of an example electrical component 200, which can be a component of a sensor assembly. The electrical component 200 includes a conductive element 205 and a dielectric material 210 according to some implementations of the current subject matter. In some embodiments, the dielectric material 210 can include a gas or a liquid, such as air, helium, nitrogen, or water. In some embodiments, the dielectric material 210 can include materials such as ceramic, mica, glass, plastic, and metal oxides.

The electrical component 200 can be configured within a support structure 215, such as a bulkhead wall through which the electrical component is configured to extend. In some embodiments, the electrical component 200 does not include a support structure 215. In some embodiments, the support structure 215 can include an additional conductive element 205 and an corresponding dielectric material 210. For example, support structure 215 can include a coaxial conductor. In some embodiments, the electrical component 200 can include an inline arrangement of two inline conductive elements 205 with a dielectric material 210 between them. The arrangement of conductive elements 205 and dielectric materials 210 can be provided without limitations without deviating from the scope described herein. In some embodiments, the electrical component 200 can include a gap 220 located between an inner surface of the dielectric material 210 and an outer surface of the conductive element 205. In some embodiments, no gap exists between the inner surface of the dielectric material 210 and the outer surface of the conductive element 205.

In some embodiments, the electrical component 200 can include a sensor, such as a gamma sensor. In some embodiments, the electrical component 200 can include a ceramic seal assembly, or a hermetically sealed assembly. In some embodiments, the dielectric material 210 can include a pressed dielectric material or an extruded dielectric material.

The electrical component 200 can be included in or coupled to industrial equipment, such as a machine or component of a machine. In some embodiments, the industrial equipment can include a valve, a turbine, a roller, and/or components of a roller machine, a compressor, and/or components of a compressor, equipment used in oil and gas production, a rudder in airplane, aircraft carrier and ships, and/or components of rudder, an artillery, and/or components of artillery. In some embodiments, the industrial equipment can include a physical system or a component of a physical system associated with a power generation production environment or an oil and gas production environment. For example, the physical system can include a steam turbine, a valve, a motor, a pump, a drill, or any similar electro-mechanical equipment of the power generation production environment.

As further shown in FIG. 2, the conductive element 205 can discharge one or more electric charges 225 across the air gap 220 between the conductive element 205 and the dielectric material 210, which can be discharged from the conductive element 205 to a medium surrounding the conductive component, such as a gas (e.g., air within the gap 220). In some embodiments, the conductive element 205 can emit one or more electric charges 225 to the dielectric material 210. In some embodiments, the electric charges can be associated with corona discharges or arc discharges. Although the charges 225 are shown in FIG. 2 as discharging across the air gap 220 from the conductive element 205 towards the dielectric material 210, in high voltage applications, the conductive element 205 is positively charged causing the flow of electrons to travel from the dielectric material 210 to the conductive element 205. In some embodiments, the electrical component 200 can be a photomultiplier tube. In some embodiments, the electrical component 200 can include one or more dynodes 230. The dynodes 230 can serve as an electron multiplier via secondary emission. The dynodes 230 can be coupled in series to the conductive element 205.

Figure 3:
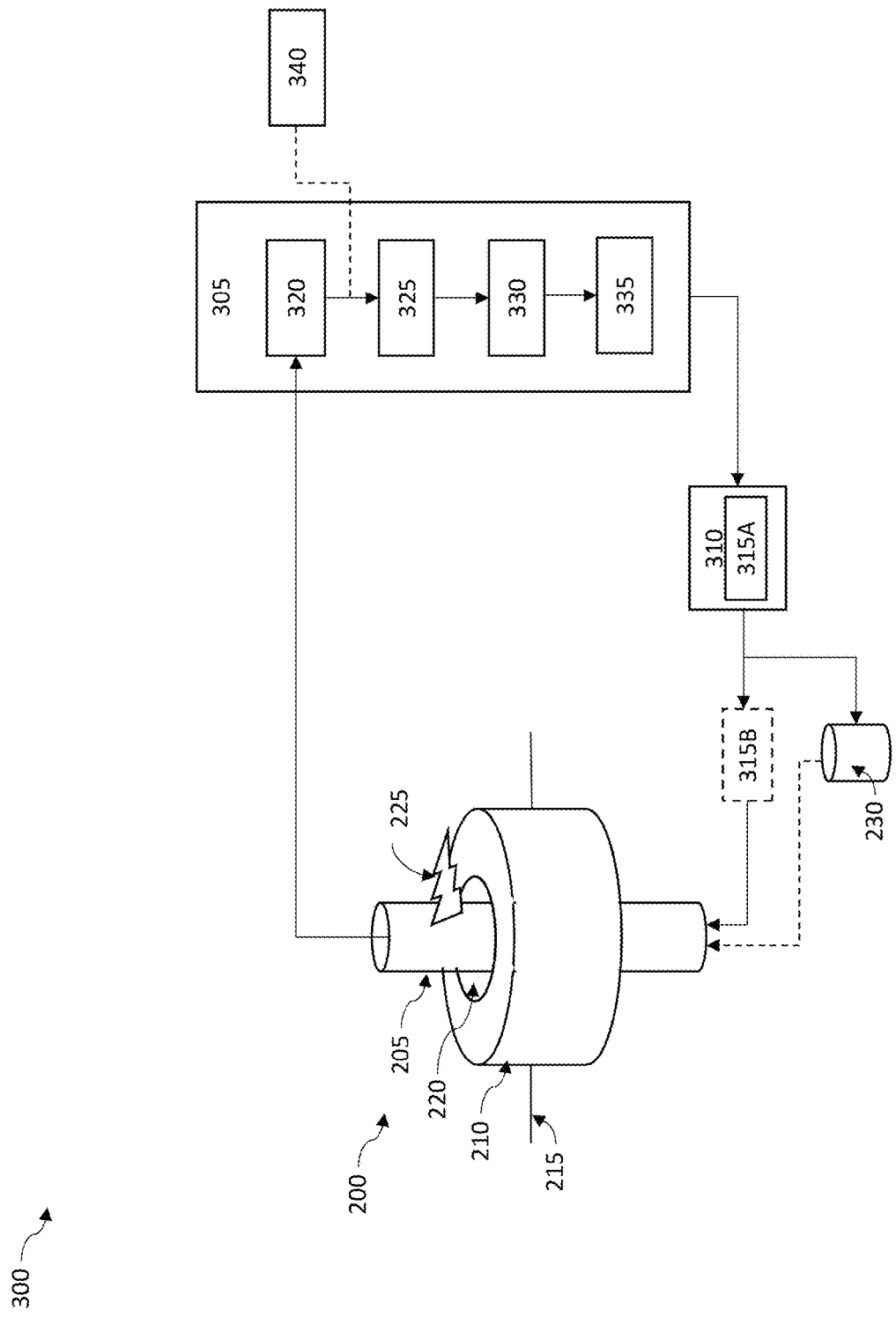
FIG. 3 illustrates a block diagram of an example charge diagnosis system according to some implementations of the current subject matter.

FIG. 3 illustrates a block diagram of an example charge diagnosis system 300 according to some implementations of the current subject matter. The charge diagnosis system 300 includes a computing device 305 configured to perform the method 100 of FIG. 1. The computing device 305 can include a processor, a memory, and one or more input devices. The processor of the computing device 305 can be configured to execute computer-readable instructions stored in the memory to perform the method 100 described in relation to FIG. 1. The memory can also store charge characterization data. The charge diagnosis system 300 can also include a high-voltage source 310. The high voltage source 310 can further include a load resistor 315, as shown by load resistor 315A. In some embodiments, the load resistor 315 may not be included in the high-voltage source 310 and may be coupled in series with conductive element 205, as shown in the configuration of FIG. 3 including a dashed line around the load resistor 315B. The high-voltage source 310 and load resistor 315 (e.g., the load resistor 315A or 315B) can be configured to provide an input voltage to the conductive element 205. In some embodiments, the high-voltage source 310 can be coupled to the computing device 305. In some embodiments, the high voltage source 310 can be a standalone component that is not coupled to the computing device 305 The input voltage can be between 0-2000 V. In some embodiments, the input voltage can be at or above 1600 V. In some embodiments the high-voltage source 310 can power one or more dynodes 230 of the electrical component 200. The dynodes 230 can receive a high-voltage input from the high-voltage source and can generate a signal of interest in the electrical component 200, as shown via the dashed line. The signal of interest can be included in an output signal generated by the conductive element 205 and can be evaluated further once received by the computing device 305

As further shown in FIG. 3, an output signal can be received from the conductive element 205 by a charge sensitive pre-amplifier 320. The charge sensitive pre-amplifier 320 includes a DC blocking capacitor and can include circuitry configured to condition the output signal for subsequent processing. In some embodiments, the load resistor 315 can be configured within the charge sensitive pre-amplifier 320. In some embodiments, the charge sensitive pre-amplifier 320 can be configured to attenuate the output signal at 0.5× prior to being received by a shaping amplifier 325.

The shaping amplifier 325 can be configured with a jumper to 0.1× internal and a gain of approximately 1.0. The shaping amplifier 325 can be further configured to apply a course gain of 20 and a fine gain of 0.5 to attenuate the impedance of the output signal. The shaping amplifier can also be configured to process the received output signal at or about 2 μs shaping time. In this way, the output signal can be arranged as a series of structured pulses to meet the time intervals (or minimum pulse width) required by the multichannel analyzer 330.

As shown in FIG. 3, the output signal generated by the shaping amplifier 325 can be received by a multichannel analyzer 330. The multichannel analyzer 330 can be configured to generate histogram data associated with the output signal. The histogram data can include the charge characterization data. In some embodiments, the multichannel analyzer 330 can include 1024 channels. In some embodiments, the multichannel analyzer 330 can include more or less channels. In some embodiments, the multichannel analyzer 330 can be configured with a low level discriminator setting of 3. The low level discriminator setting can correspond to the lowest level signal that will be recorded from the shaping amplifier 325.

The computing device 305 can also include a display 335. The charge characterization data can be provided to a user via the display 335. In some embodiments, the display 335 can include a graphical user interface (GUI). The GUI can display the charge characterization data. In some embodiments, the GUI can be configured to display an alarm or notification based on the charge characterization data. The alarm or notification can be provided to a user in relation to classifying the electrical component, the conductive element, and/or the dielectric material as functional or defective.

In some embodiments, the charge diagnosis system 300 can also include a scope 340, such as an oscilloscope. The scope 340 can be configured to visualize the output signal from the charge sensitive pre-amplifier 320.

Figure 4:
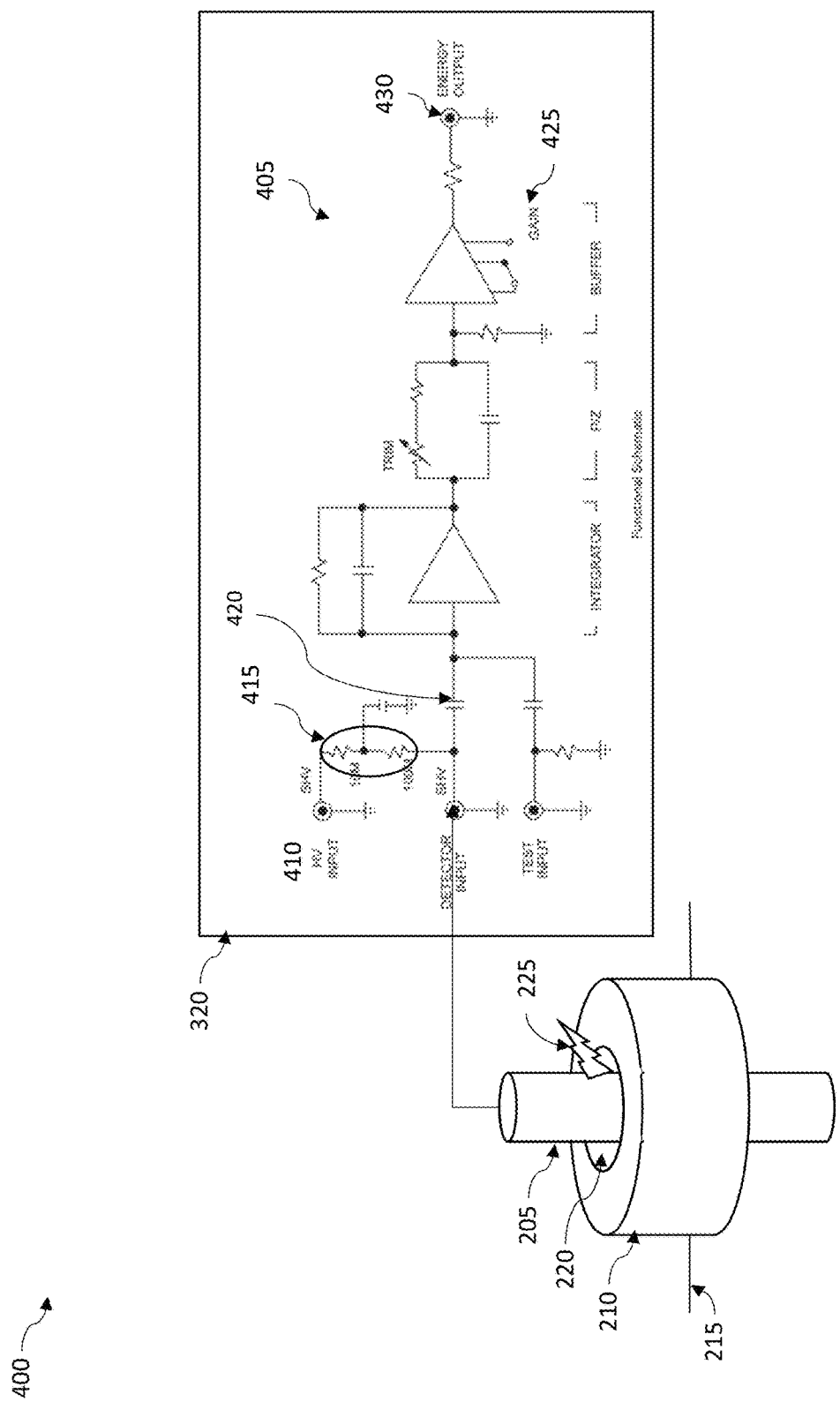
FIG. 4 illustrates a schematic diagram of an example charge sensitive preamplifier included in the charge diagnosis system of FIG. 3 according to some implementations of the current subject matter.

FIG. 4 illustrates a schematic diagram of an example the charge sensitive preamplifier 320 included in the charge diagnosis system of FIG. 3. As shown in FIG. 4, the charge sensitive amplifier 320 can include circuitry 405 configured to receive the output signal from the conductive element and to process the output signal. In the embodiment shown in FIG. 4, high voltage input 410 is applied to the conductor 205 via a 110 Mega Ohm resistor load shown within the circle 415. The AC coupling capacitor 420 decouples the high voltage input 410 applied onto the conductor 205 from the pre-amplifier signal processing circuitry. AC pulses are transmitted across the AC coupling capacitor 420 to the input of a charge integration circuit and additional signal conditioning circuitry. A gain 425 is applied to the processed analog signal and made available via a coaxial output port 430.

Figure 5:
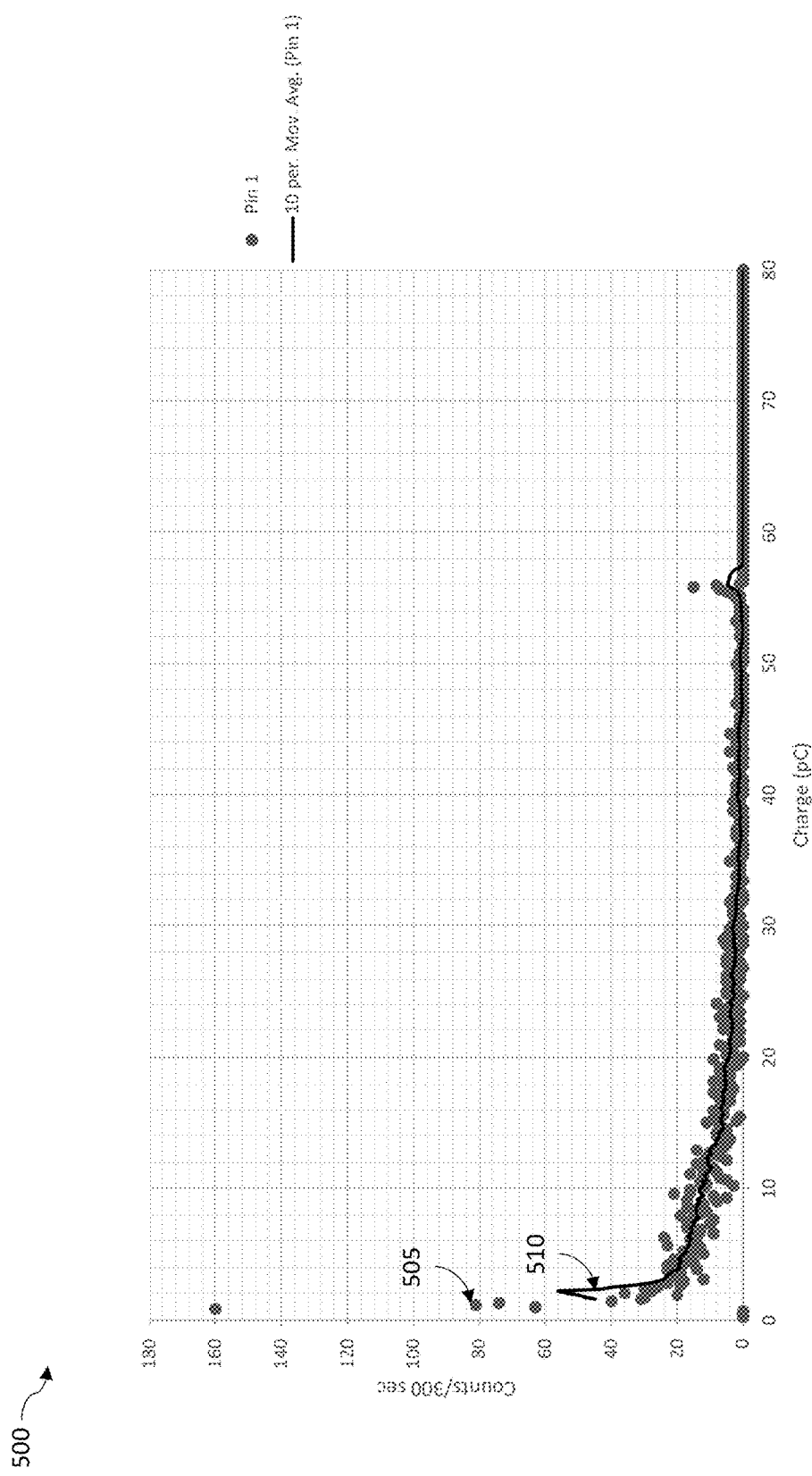
FIG. 5 illustrates a plot of a charge magnitude and charge distribution for an electrical component according to some implementations of the current subject matter.

FIG. 5 illustrates a plot 500 of a charge magnitude and charge distribution for an electrical component, such as the electrical component 200 described in relation to FIG. 2. As shown in FIG. 5, a plurality of charges associated with a conductive element 205, e.g., "Pin 1", are plotted. The X-axis represents a magnitude of a charge in pico-Coulombs. The Y-axis represents a count of a number of charges emitted by the conductive element in a 5 minute time period, e.g., 300 seconds. For example, reference 505 describes that there were 82 charges which occurred in the 5 minute time period which had a charge magnitude of less than 2 pico-Coulombs. As further shown in FIG. 5, the plot 500 includes a moving average 510 calculated for cumulatively for every 10 charges.

Figure 6:
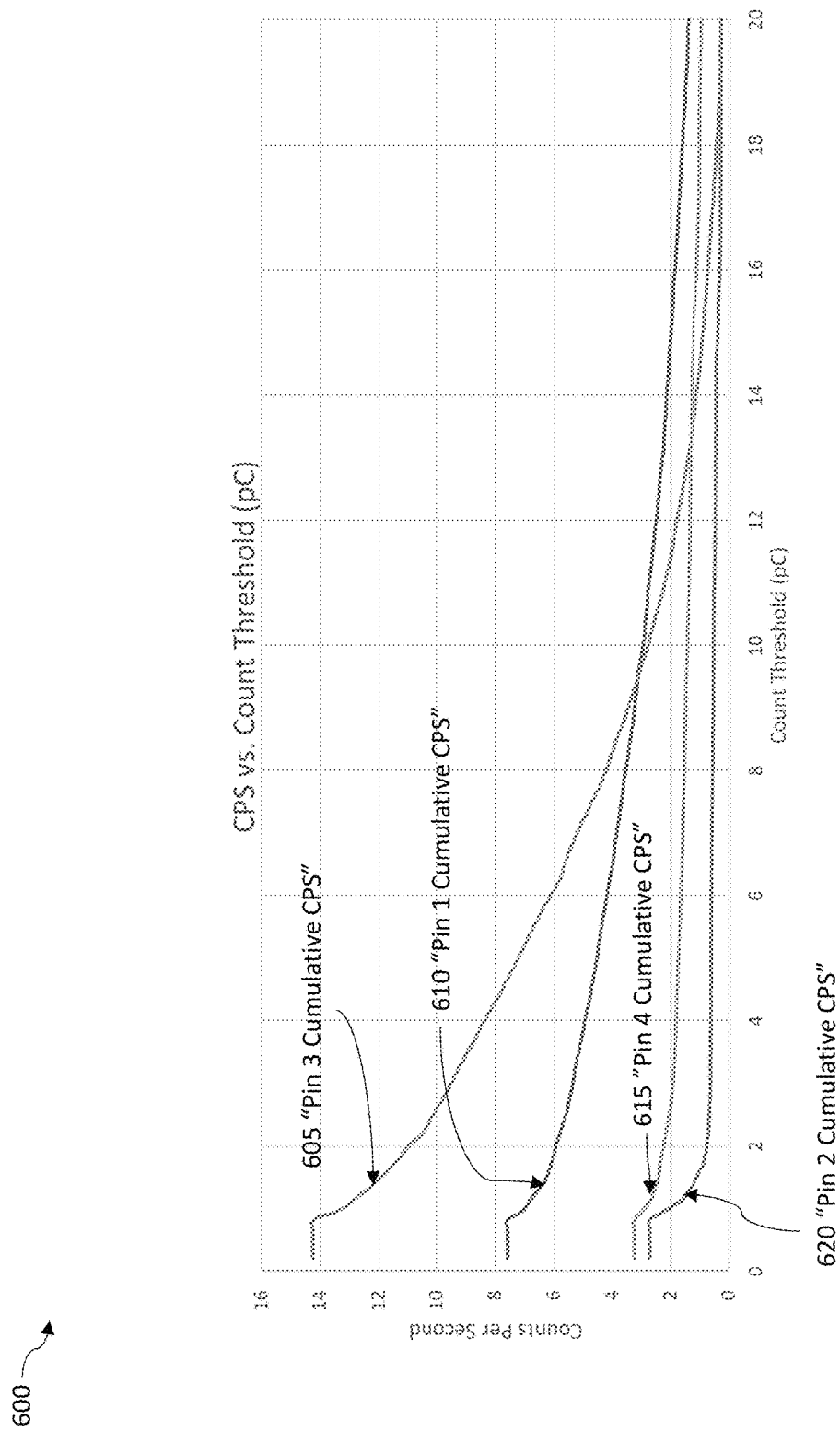
FIG. 6 illustrates a plot of a plurality of threshold values for applied to a plurality of charge distributions associated with a plurality of electrical components according to some implementations of the current subject matter.

FIG. 6 illustrates a plot 600 of a plurality of threshold values applied to a plurality of charge distributions associated with a plurality of electrical components according to some implementations of the current subject matter. As shown in plot 600, cumulative counts per second (CPS) for four conductive elements, (e.g., Pin 1, Pin 2, Pin 3, and Pin 4) are plotted with respect to a range of threshold values corresponding to the magnitude of charges emitted from each of the four conductive elements. For example, as shown by reference 605, Pin 3 emitted 11 counts per second that were at or above 2 pico-Coulombs, while Pin 1 emitted 6 counts per second that were at or above 2 pico-Coulombs as shown by reference 610. As shown by references 615 and 620, Pin 4 and Pin 2, respectively, each had fewer emitted charges at or above 2 pico-Coulombs. Thus, the conductive element associated with reference 620, e.g., Pin 2, can be interpreted to emit fewer electrical charges at 2 pico-Coulombs, than any of the other conductive elements (e.g., reference 615 corresponding to Pin 4, reference 610 corresponding to Pin 1, and reference 605 corresponding to Pin 3), and as such the conductive element corresponding to Pin 2 may be classified as functional and not defective.

Exemplary technical effects of the methods, systems, and computer-readable medium described herein include, by way of non-limiting example, determining charge characterization data corresponding to charges emitted by a conductive element and classifying the conductive element and/or a dielectric material based on the charge characterization data. Providing the charge characterization data and classification data related to the conductive element can improve defect detection and defect classification of electrical components operable within high-temperature, high-voltage applications and/or environments. The charge diagnosis system can be configured to perform the methods described herein and can provide more robust diagnostic data associated with a magnitude, type, and distribution or electric charges emitted by conductive elements and/or electrical components. The computing devices included in the charge diagnosis include an improved graphical user interface for providing charge characterization data.

Certain exemplary embodiments have been described to provide an overall understanding of the principles of the structure, function, manufacture, and use of the systems, devices, and methods disclosed herein. One or more examples of these embodiments have been illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment can be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon.

The subject matter described herein can be implemented in analog electronic circuitry, digital electronic circuitry, and/or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, can be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language can correspond to the precision of an instrument for measuring the value. Here and throughout the specification and claims, range limitations can be combined and/or interchanged, such ranges are identified and include all the sub-ranges contained therein unless context or language indicates otherwise.

One skilled in the art will appreciate further features and advantages of the invention based on the above-described embodiments. Accordingly, the present application is not to be limited by what has been particularly shown and described, except as indicated by the appended claims. All publications and references cited herein are expressly incorporated by reference in their entirety.

The invention claimed is:
1. A method comprising:
receiving an output signal from a conductive element configured within a dielectric material, the conductive element having an input voltage applied thereto and the output signal including a plurality of signal amplitudes indicative of electric charges discharged across a gap between the conductive element and the dielectric material in response to the applied input voltage;
determining, based on the plurality of signal amplitudes, charge characterization data corresponding to the electric charges emitted by the conductive element, wherein the charge characterization data includes a magnitude of the electric charges and a distribution of the electric charges occurring within a pre-determined period of time, wherein determining the magnitude of the electric charges includes identifying signal amplitudes in the output signal that are between a pre-determined range, wherein determining the distribution of the electric charges includes:
determining a number of occurrences of the identified signal amplitudes occurring within the pre-determined period of time; and
producing a histogram based on the number of occurrences of the identified signal amplitudes occurring within a pre-determined period of time with respect to the determined magnitude of the electric charges; and classifying an operational state of the conductive element and/or the dielectric material based on the charge characterization data.

2. The method of claim 1, wherein determining the distribution of the electric charges further includes
determining a moving average of the number of the identified signal amplitudes occurring within the pre-determined period of time; and
providing the moving average of the number of the identified signal amplitudes occurring within the pre-determined period of time with respect to the determined magnitude of the electric charges.

3. The method of claim 1, wherein determining the distribution of the electric charges further includes
determining a plurality of threshold values corresponding to the determined magnitude of the electric charges; and
providing the number of the identified signal amplitudes occurring within a pre-determined period of time with respect to the plurality of threshold values.

4. The method of claim 1, wherein the conductive element is configured within a high-temperature environment at or above 150 degrees Celsius.

5. The method of claim 1, wherein the input voltage applied to the conductive element is at or above 1600 V.

6. The method of claim 1, wherein the conductive element configured within the dielectric material is included in a gamma sensor.

7. The method of claim 1, wherein classifying the operational state of the conductive element and/or the dielectric material includes classifying the conductive element as one of an operable conductive element and a defective conductive element, and/or classifying the dielectric material includes classifying the dielectric material as one of an operative dielectric material and a defective dielectric material.

8. The method of claim 1, wherein the charge characterization data is indicative of a corona discharge or an arc discharge emitted by the conductive element in response to the applied input voltage.

9. A system comprising:
a high-voltage source;
a conductive element including a conductor and coupled to the high-voltage source, the conductive element configured within a dielectric material;
a computing device coupled to the conductive element, the computing device including at least one data processor, and a memory storing instructions, which when executed by the at least one data processor causes the at least one data processor to perform operations comprising:
receiving an output signal from the conductive element configured within the dielectric material, the conductive element having an input voltage applied thereto from the high-voltage source and the output signal including a plurality of signal amplitudes indicative of electric charges discharged across a gap between the conductive element and the dielectric material in response to the applied input voltage;
determining, based on the plurality of signal amplitudes, charge characterization data corresponding to the electric charges emitted by the conductive element, wherein the charge characterization data includes a magnitude of the electric charges and a distribution of the electric charges occurring within a pre-determined period of time, wherein determining the magnitude of the electric charges includes identifying signal amplitudes in the output signal that are between a pre-determined range, wherein determining the distribution of the electric charges includes:
determining a number of occurrences of the identified signal amplitudes occurring within the pre-determined period of time; and
producing a histogram based on the number of occurrences of the identified signal amplitudes occurring within a pre-determined period of time with respect to the determined magnitude of the electric charges; and
classifying an operational state of the conductive element and/or the dielectric material based on the charge characterization data.

10. The system of claim 9, wherein determining the distribution of the electric charges includes
determining a moving average of the number of the identified signal amplitudes occurring within the pre-determined period of time; and
providing the moving average of the number of the identified signal amplitudes occurring within the pre-determined period of time with respect to the determined magnitude of the electric charges.

11. The system of claim 9, wherein determining the distribution of the electric charges includes
determining a plurality of threshold values corresponding to the determined magnitude of the electric charges; and
providing the number of the identified signal amplitudes occurring within a pre-determined period of time with respect to the plurality of threshold values.

12. The system of claim 9, wherein the conductive element is configured within a high-temperature environment at or above 150 degrees Celsius.

13. A non-transitory, machine readable storage medium containing program instructions, which when executed cause one or more processors to perform a method of:
receiving an output signal from a conductive element configured within a dielectric material, the conductive element having an input voltage applied thereto and the output signal including a plurality of signal amplitudes indicative of electric charges discharged across a gap between the conductive element and the dielectric material in response to the applied input voltage;
determining, based on the plurality of signal amplitudes, charge characterization data corresponding to the electric charges emitted by the conductive element, wherein the charge characterization data includes a magnitude of the electric charges and a distribution of the electric charges occurring within a pre-determined period of time, wherein determining the magnitude of the electric charges includes identifying signal amplitudes in the output signal that are between a pre-determined range, wherein determining the distribution of the electric charges includes:
determining a number of occurrences of the identified signal amplitudes occurring within the pre-determined period of time; and
producing a histogram based on the number of occurrences of the identified signal amplitudes occurring within a pre-determined period of time with respect to the determined magnitude of the electric charges; and classifying an operational state of the conductive element and/or the dielectric material based on the charge characterization data.

* * * * *